(12) United States Patent
Fan et al.

(10) Patent No.: US 12,363,988 B2
(45) Date of Patent: Jul. 15, 2025

(54) INNER SPACER FEATURES FOR MULTI-GATE TRANSISTORS

(71) Applicant: Taiwan Semiconductor Manufacturing Company, Ltd., Hsin-Chu (TW)

(72) Inventors: Wei-Han Fan, Hsin-Chu (TW); Chia-Pin Lin, Hsinchu County (TW); Wei-Yang Lee, Taipei (TW); Tzu-Hua Chiu, Hsinchu (TW); Kuan-Hao Cheng, Hsinchu (TW); Po Shao Lin, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 545 days.

(21) Appl. No.: 17/737,660

(22) Filed: May 5, 2022

(65) Prior Publication Data

US 2023/0018266 A1 Jan. 19, 2023

Related U.S. Application Data

(60) Provisional application No. 63/220,336, filed on Jul. 9, 2021.

(51) Int. Cl.
| | |
|---|---|
| H10D 64/66 | (2025.01) |
| H01L 21/02 | (2006.01) |
| H01L 21/28 | (2025.01) |
| H01L 21/285 | (2006.01) |
| H10D 30/01 | (2025.01) |
| H10D 30/67 | (2025.01) |
| H10D 62/10 | (2025.01) |
| H10D 64/01 | (2025.01) |
| H10D 64/62 | (2025.01) |

(52) U.S. Cl.
CPC ....... *H10D 64/679* (2025.01); *H01L 21/0259* (2013.01); *H01L 21/28123* (2013.01);
(Continued)

(58) Field of Classification Search
CPC .......... H01L 29/66439; H01L 29/0673; H01L 29/775; H01L 21/28123; H01L 29/42392; H01L 29/66553; H01L 29/0653; H01L 29/66742; H01L 29/0665; H01L 21/28518; H01L 29/66545; H01L 29/78618;
(Continued)

(56) References Cited

U.S. PATENT DOCUMENTS 9,954,058 B1 * 4/2018 Mochizuki ........ H01L 29/42392
10,361,202 B2 * 7/2019 Suh ................. H01L 21/823821
(Continued)

OTHER PUBLICATIONS

Po-Yu Huang et al., "Backside Via With a Low-K Spacer" U.S. Appl. No. 17/213,889, filed Mar. 26, 2021, Assignee Taiwan Semiconductor Manufacturing Company, Ltd, 31 pages of Specification, 23 pages of drawings.

*Primary Examiner* — Mouloucoulaye Inoussa
(74) *Attorney, Agent, or Firm* — HAYNES AND BOONE, LLP

(57) ABSTRACT

A semiconductor device and a method of forming the same are provided. In an embodiment, an exemplary semiconductor device includes a vertical stack of channel members disposed over a substrate, a gate structure wrapping around each channel member of the vertical stack of channel members, and a source/drain feature disposed over the substrate and coupled to the vertical stack of channel members. The source/drain feature is spaced apart from a sidewall of the gate structure by an air gap and a dielectric layer, and the air gap extends into the source/drain feature.

20 Claims, 12 Drawing Sheets

(52) U.S. Cl.
CPC ..... *H01L 21/28518* (2013.01); *H10D 30/031* (2025.01); *H10D 30/6713* (2025.01); *H10D 30/6735* (2025.01); *H10D 30/6757* (2025.01); *H10D 62/118* (2025.01); *H10D 64/017* (2025.01); *H10D 64/018* (2025.01); *H10D 64/62* (2025.01)

(58) Field of Classification Search
CPC ................ H01L 29/0847; H01L 29/45; H01L 29/78696; H01L 29/4991; H01L 21/0259; H01L 29/41766; H01L 29/165; H01L 29/7848; H01L 29/665; H01L 29/6681; H01L 21/823864; H01L 29/161; H01L 27/092; H01L 29/1079; B82Y 10/00
See application file for complete search history.

(56) References Cited

U.S. PATENT DOCUMENTS

| | | | |
|---|---|---|---|
| 11,189,705 B2 | 11/2021 | Wong et al. | |
| 11,289,584 B2 | 3/2022 | Wu et al. | |
| 2017/0110554 A1* | 4/2017 | Tak | H01L 29/42392 |
| 2018/0331232 A1* | 11/2018 | Frougier | H01L 29/78618 |
| 2018/0358435 A1* | 12/2018 | Mochizuki | H01L 29/0673 |
| 2019/0157414 A1* | 5/2019 | Ando | H01L 21/02603 |
| 2019/0157444 A1* | 5/2019 | Yang | H01L 29/6681 |
| 2019/0305104 A1* | 10/2019 | Xie | H01L 29/4908 |
| 2020/0126798 A1* | 4/2020 | Lin | H01L 29/78618 |
| 2020/0381547 A1* | 12/2020 | Song | H01L 29/66795 |
| 2020/0402980 A1* | 12/2020 | Suh | H01L 29/6656 |
| 2020/0411667 A1* | 12/2020 | Wong | H01L 21/022 |
| 2021/0082686 A1 | 3/2021 | Chiang | |
| 2021/0082914 A1* | 3/2021 | Lee | H01L 21/823468 |
| 2021/0151556 A1* | 5/2021 | Wu | B82Y 10/00 |
| 2021/0173103 A1* | 6/2021 | Zalevsky | G02B 27/46 |
| 2021/0217860 A1* | 7/2021 | Ha | H01L 29/66545 |
| 2021/0234047 A1* | 7/2021 | Tsai | H01L 29/0653 |
| 2021/0391423 A1* | 12/2021 | Lin | H01L 29/42392 |
| 2021/0391466 A1* | 12/2021 | Yeong | H01L 29/6653 |
| 2021/0407856 A1* | 12/2021 | Wang | H01L 29/66553 |
| 2022/0069078 A1* | 3/2022 | Yu | H01L 29/78696 |
| 2022/0115514 A1* | 4/2022 | Jung | H01L 29/775 |
| 2022/0173053 A1* | 6/2022 | Park | H01L 29/0673 |
| 2022/0181499 A1* | 6/2022 | Jung | H01L 29/0673 |
| 2022/0320276 A1* | 10/2022 | Lin | H01L 29/4991 |

* cited by examiner

INNER SPACER FEATURES FOR MULTI-GATE TRANSISTORS

CROSS-REFERENCE TO RELATED APPLICATIONS

This is a non-provisional application of and claims priority to U.S. Provisional Patent Application Ser. No. 63/220,336, filed on Jul. 9, 2021, the entire disclosure of which is incorporated herein by reference.

BACKGROUND

The semiconductor industry has experienced rapid growth. Technological advances in semiconductor materials and design have produced generations of semiconductor devices where each generation has smaller and more complex circuits than the previous generation. In the course of integrated circuit (IC) evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. But these advances have also increased the complexity of processing and manufacturing semiconductor devices.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, or other nanostructures and for that reason, an MBC transistor may also be referred to as a nanowire transistor or a nanosheet transistor.

Inner spacer features have been implemented in MBC transistors to isolate a gate structure from an epitaxial source/drain feature. The design of inner spacer features needs to strike a difficult balance between having sufficient etch resistance and maintaining a low dielectric constant. More specifically, to protect the source/drain feature from being damaged by an etching process for releasing channel members of the MBC transistors, the inner spacer features may be formed of an etch resistant dielectric material that tends to have a high dielectric constant. However, the high dielectric constant may lead to a high parasitic capacitance between the gate structure and the source/drain feature. Therefore, while existing inner spacer features may be generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
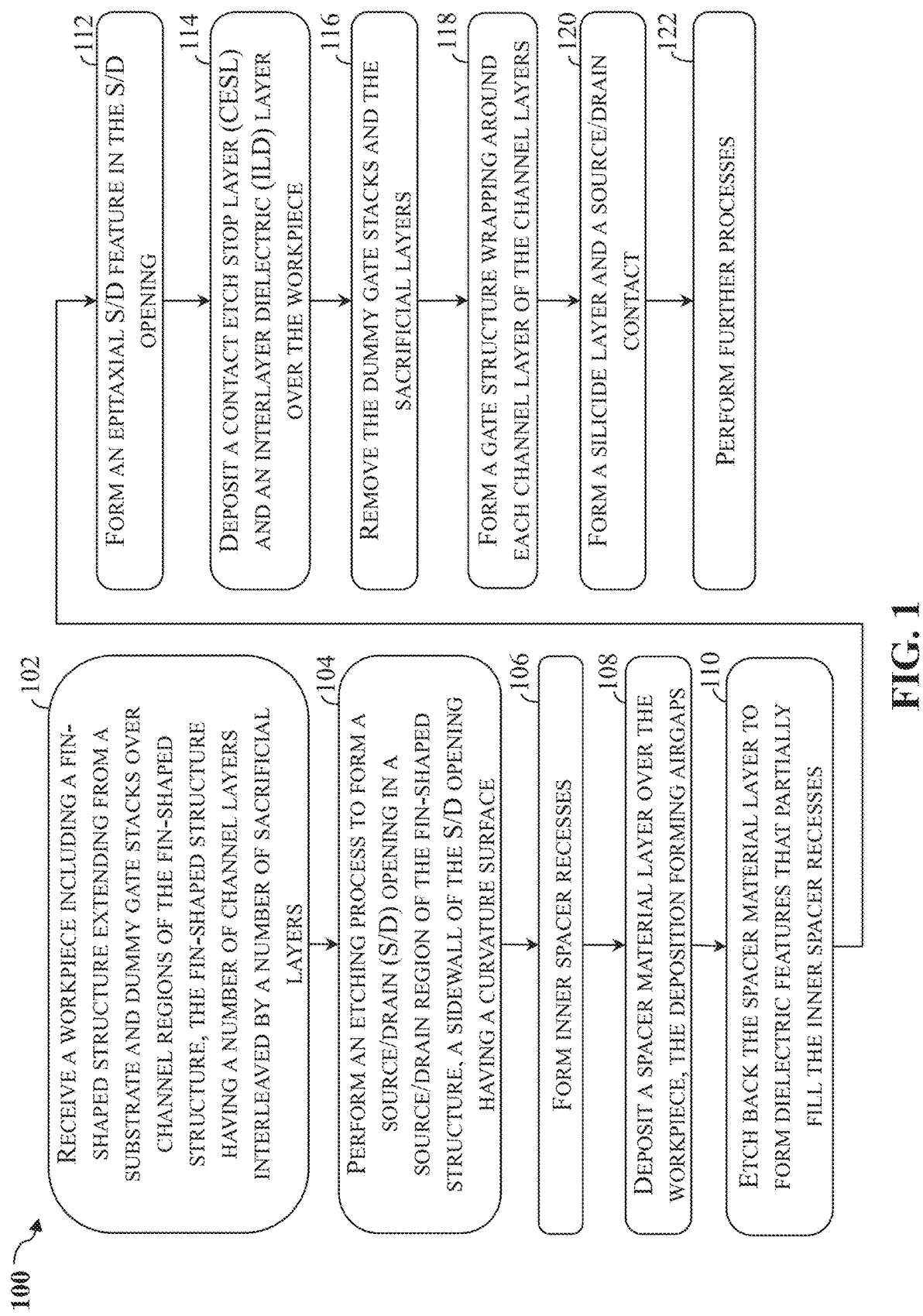
FIG. 1 illustrates a flow chart of a method for forming a semiconductor device including a composite inner spacer feature having a dielectric layer and an air gap, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

As described above, MBC transistors may also be referred to as SGTs, GAA transistors, nanosheet transistors, or nanowire transistors. They can be either n-type or p-type. MBC devices according to the present disclosure may have channel regions disposed in nanowire channel members, bar-shaped channel members, nanosheet channel members, nanostructure channel members, bridge-shaped channel members, and/or other suitable channel configurations. Inner spacer features have been implemented between channel members to isolate a gate structure from a source/drain feature. Before channel release process, inner spacer features cap two ends of sacrificial layers. During the channel release process, inner spacer features contain the etching to the sacrificial layers and prevent source/drain features from being damaged. For that reason, it may be desirable for the inner spacer features to include a dielectric material having considerable etching resistance (i.e., with a relatively higher dielectric constant) to ensure the inner spacer features remain intact while removing the sacrificial layers during the channel release process. However, such dielectric material may inadvertently increase the parasitic capacitance in portions of the semiconductor device near the inner spacer features (e.g., the parasitic capacitance between the source/drain feature and a metal gate), thereby degrading the performance of the semiconductor device.

The present disclosure is directed to semiconductor devices with reduced parasitic capacitance and methods of forming the semiconductor devices without compromising other aspects of the design requirements. In an embodiment, an exemplary semiconductor device includes a vertical stack of channel members disposed over a substrate, a gate structure wrapping around each channel member of the vertical stack of channel members, and an epitaxial source/drain feature disposed over the substrate and coupled to the vertical stack of channel members. The epitaxial source/drain feature is spaced apart from a sidewall of the gate structure by an air gap and a dielectric layer, and the air gap extends into the S/D feature. The following disclosure will continue with one or more GAA FETs as example multi-gate transistors to illustrate various embodiments of the present disclosure. It is understood, however, that the application should not be limited to a particular type of device and may be applicable to other multi-gate transistors.

The various aspects of the present disclosure will now be described in more detail with reference to the figures. In that regard, FIG. 1 is a flowchart illustrating method 100 of forming a semiconductor device according to embodiments of the present disclosure. Method 100 is described below in conjunction with FIGS. 2-12, which are fragmentary cross-sectional views of a workpiece 200 at different fabrication stages according to embodiments of method 100. Method 100 is merely an example and is not intended to limit the present disclosure to what is explicitly illustrated therein. Additional steps may be provided before, during, and/or after the method 100, and some steps described can be replaced, eliminated, or moved around for additional embodiments of the method. Not all steps are described herein in detail for reasons of simplicity. Because the workpiece 200 will be fabricated into a semiconductor device 200 upon conclusion of the fabrication processes, the workpiece 200 may be referred to as the semiconductor device 200 as the context requires. For avoidance of doubts, the X, Y and Z directions in FIGS. 2-12 are perpendicular to one another and are used consistently throughout FIGS. 2-12. Throughout the present disclosure, like reference numerals denote like features unless otherwise excepted.

Figure 2:
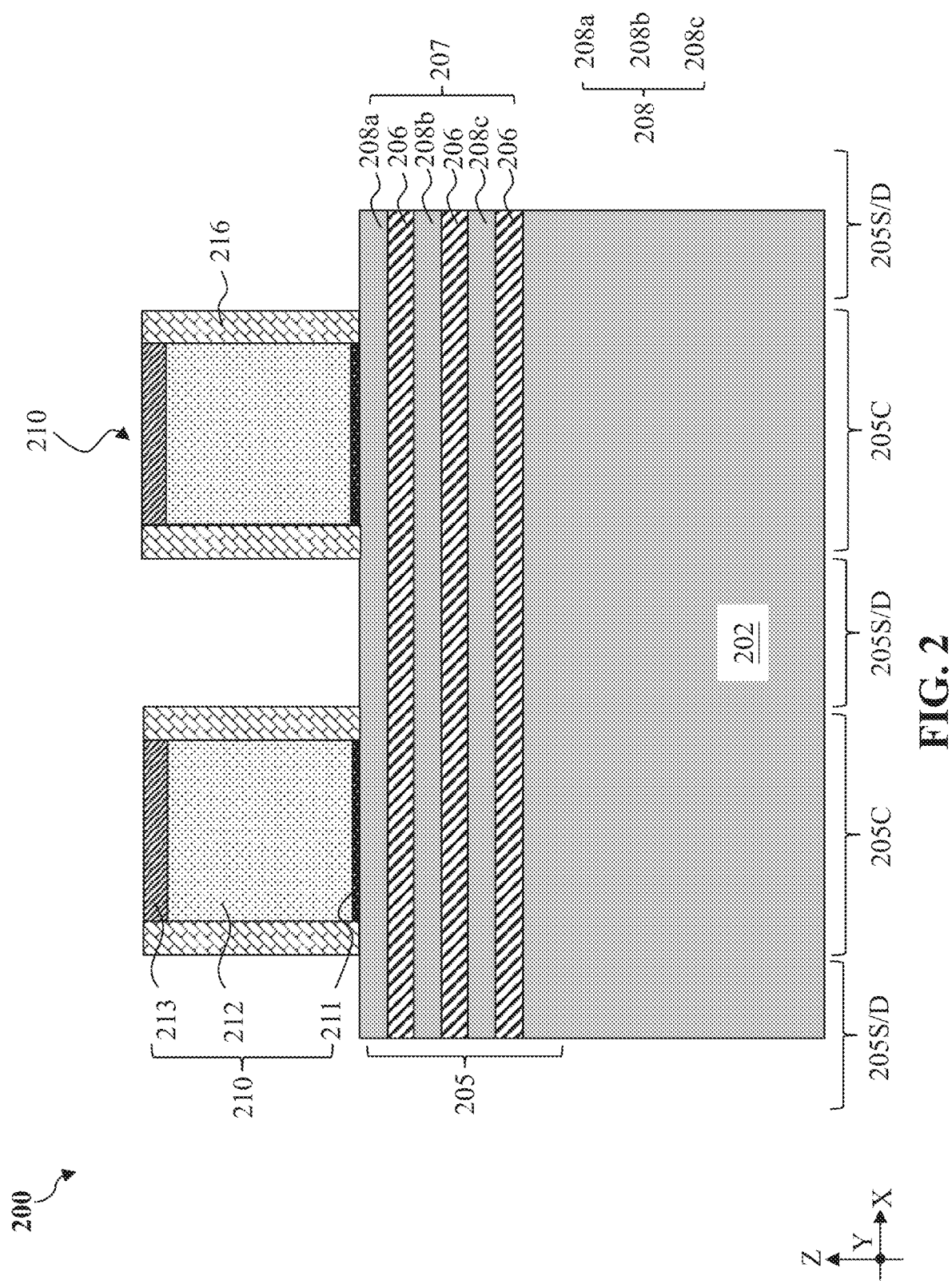
FIGS. 2, 3, 4, 5, 6, 7, 8, 9, 10, 11 and 12 (FIGS. 2-12) illustrate fragmentary cross-sectional views of a workpiece during various fabrication stages in the method of FIG. 1, according to one or more aspects of the present disclosure.

Referring to FIGS. 1 and 2, method 100 includes a block 102 where a workpiece 200 is received. The workpiece 200 includes a substrate 202. In an embodiment, the substrate 202 is a bulk silicon substrate (i.e., including bulk single-crystalline silicon). The substrate 202 may include other semiconductor materials in various embodiments, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. In some alternative embodiments, the substrate 202 may be a semiconductor-on-insulator substrate, such as a silicon-on-insulator (SOI) substrate, a silicon germanium-on-insulator substrate, or a germanium-on-insulator substrate, and includes a carrier, an insulator on the carrier, and a semiconductor layer on the insulator. The substrate 202 can include various doped regions configured according to design requirements of semiconductor device 200. P-type doped regions may include p-type dopants, such as boron (B), boron difluoride ($BF_2$), other p-type dopant, or combinations thereof. N-type doped regions may include n-type dopants, such as phosphorus (P), arsenic (As), other n-type dopant, or combinations thereof.

The workpiece 200 includes a fin-shaped structure 205 disposed over the substrate 202. The fin-shaped structure 205 extends lengthwise along the X direction and is divided into channel regions 205C and source/drain regions 205S/D, and the channel regions 205C is disposed between two source/drain regions 205S/D along the X direction. The fin-shaped structure 205 may be formed from a portion of the substrate 202 and a vertical stack 207 of alternating semiconductor layers 206 and 208 using a combination of lithography and etch steps. An exemplary lithography process includes spin-on coating a photoresist layer, soft baking of the photoresist layer, mask aligning, exposing, post-exposure baking, developing the photoresist layer, rinsing, and drying (e.g., hard baking). In some instances, the patterning of the fin-shaped structure 205 may be performed using double-patterning or multi-patterning processes to create patterns having pitches smaller than what is otherwise obtainable using a single, direct photolithography process. The etching process can include dry etching, wet etching, and/or other suitable processes.

In an embodiment, the vertical stack 207 includes a number of channel layers 208 interleaved by a number of sacrificial layers 206. Each channel layer 208 may include a semiconductor material such as, silicon, germanium, silicon carbide, silicon germanium, GeSn, SiGeSn, SiGeCSn, other suitable semiconductor material, or combinations thereof, while each sacrificial layer 206 has a composition different from that of the channel layer 208. The channel layers 208 and the sacrificial layers 206 may be epitaxially deposited on the substrate 202 using molecular beam epitaxy (MBE), vapor-phase epitaxy (VPE), ultra-high vacuum CVD (UHV-CVD), and/or other suitable epitaxial growth processes. In an embodiment, the channel layer 208 includes silicon (Si), the sacrificial layer 206 includes silicon germanium (SiGe). It is noted that three layers of the sacrificial layers 206 and three layers of the channel layers 208 (e.g., topmost channel layer 208a, middle channel layer 208b, bottommost channel layer 208c) are alternately and vertically arranged as illustrated in FIG. 2, which are for illustrative purposes only and not intended to limit the present disclosure to what is explicitly illustrated therein.

While not explicitly shown in FIG. 2, an isolation feature is also formed around the fin-shaped structure 205 to isolate the fin-shaped structure 205 from an adjacent fin-shaped structure. In some embodiments, the isolation feature is deposited in trenches that define the fin-shaped structure 205. Such trenches may extend through the channel layers 208 and sacrificial layers 206 and terminate in the substrate 202. The isolation feature may also be referred to as a shallow trench isolation (STI) feature. In an exemplary process, a dielectric material for the isolation feature is deposited over the workpiece 200 using CVD, subatmospheric CVD (SACVD), flowable CVD (FCVD), physical vapor deposition (PVD), spin-on coating, and/or other suitable process. The deposited dielectric material is then planarized and recessed until the fin-shaped structure 205 rises above the isolation feature. The dielectric material for the isolation feature may include silicon oxide, silicon oxynitride, fluorine-doped silicate glass (FSG), a low-k dielectric, combinations thereof, and/or other suitable materials.

Still referring to FIG. 2, the workpiece 200 also includes dummy gate stacks 210 disposed over channel regions 205C of the fin-shaped structure 205. The source/drain regions 205S/D are not vertically overlapped by the dummy gate stacks 210. Two dummy gate stacks 210 are shown in FIG. 2 but the workpiece 200 may include more dummy gate stacks 210. In this embodiment, a gate replacement process (or gate-last process) is adopted where the dummy gate stacks 210 serve as placeholders for functional gate structures (e.g., gate structures 242 shown in FIG. 10). Other processes and configurations are possible. The dummy gate stack 210 includes a dummy dielectric layer 211, a dummy gate electrode layer 212 over the dummy dielectric layer 211, and a gate-top hard mask layer 213 over the dummy gate electrode layer 212. The dummy dielectric layer 211 may include silicon oxide. The dummy gate electrode layer 212 may include polysilicon. The gate-top hard mask layer 213 may include silicon oxide layer, silicon nitride, a combination thereof, or other suitable material. Suitable deposition process, photolithography and etching process may be employed to form the dummy gate stack 210.

Still referring to FIG. 2, after the formation of the dummy gate stack 210, gate spacer layers 216 are formed along sidewalls of the dummy gate stack 210. In some embodiments, the formation of the gate spacer layer 216 includes a conformal deposition of one or more dielectric layers over the workpiece 200 and etch-back of the gate spacer layer 216 from top-facing surfaces of the workpiece 200. In an example process, the one or more dielectric layers are deposited using CVD, SACVD, or ALD and are etched back by an anisotropic etch process to form the gate spacer layer 216. The gate spacer layer 216 may include silicon oxide, silicon nitride, silicon carbide, silicon oxynitride, silicon carbonitride, silicon oxycarbide, silicon oxycarbonitride, other suitable materials, and/or combinations thereof.

Figure 3:
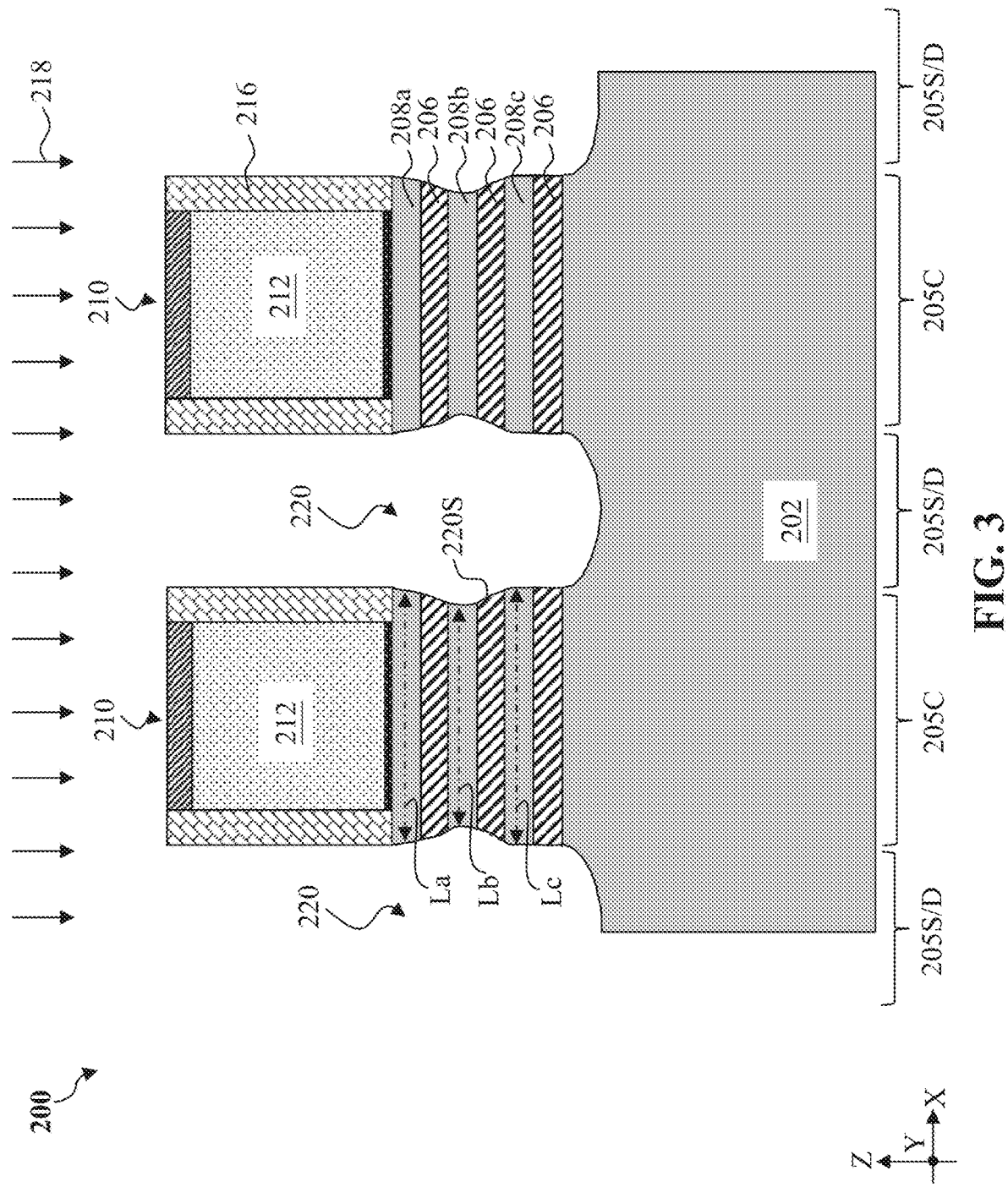

Referring to FIGS. 1 and 3, method 100 includes a block 104 where an etching process 218 is performed to form a source/drain opening 220 in the source/drain region 205S/D of the fin-shaped structure 205. In embodiments represented in FIG. 3, the source/drain regions 205S/D of the fin-shaped structure 205, which are not masked by the gate-top hard mask layer 213 and the gate spacer layer 216, are recessed to form the source/drain openings 220. In the present embodiment, the etching process 218 not only etches the channel layers 208 and sacrificial layers 206 in the source/drain region 205S/D, but also etches away portions of the channel layers 208 and sacrificial layers 206 in the channel region 205C. Sidewalls of the sacrificial layers 206 and the channel layers 208 exposed in the source/drain opening 220 may be collectively referred to as a sidewall 220S. In embodiment represented in FIG. 3, the sidewall 220S curves inward, and a length Lb of the channel layer 208b in the channel region 205C along the X direction is smaller than a length La of the channel layer 208a and a length Lc of the channel layer 208c. In an embodiment, the length Lc of the channel layer 208c is greater than the length La of the channel layer 208a. That is, a volume of the portion of the channel layer 208b that is removed by the etching process 218 is greater than a volume of the portion of the channel layer 208a and volume of the portion of the channel layer 208c removed by the etching process 218.

The etching process 218 may be a dry etching process or other suitable etching process. The dry etching process may implement an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In an embodiment, a combination of HBr and He may be implemented by the etching process 218 to form the source/drain opening 220. Various etching parameters associated with the etching process 218 may be tuned to achieve the profile (i.e., curved surface) of the sidewall 220S, such as etching temperature, etching time, etching pressure, source power, RF bias voltage, RF bias power, etchant flow rate, other suitable etching parameters, or combinations thereof. For example, the RF bias power may be controlled such that the combination of HBr and He would react with the middle channel layer 208b and the sacrificial layers 206s thereon and thereunder while not substantially reacting with the topmost channel layer 208a or the bottommost channel layer 208c.

Figure 4:
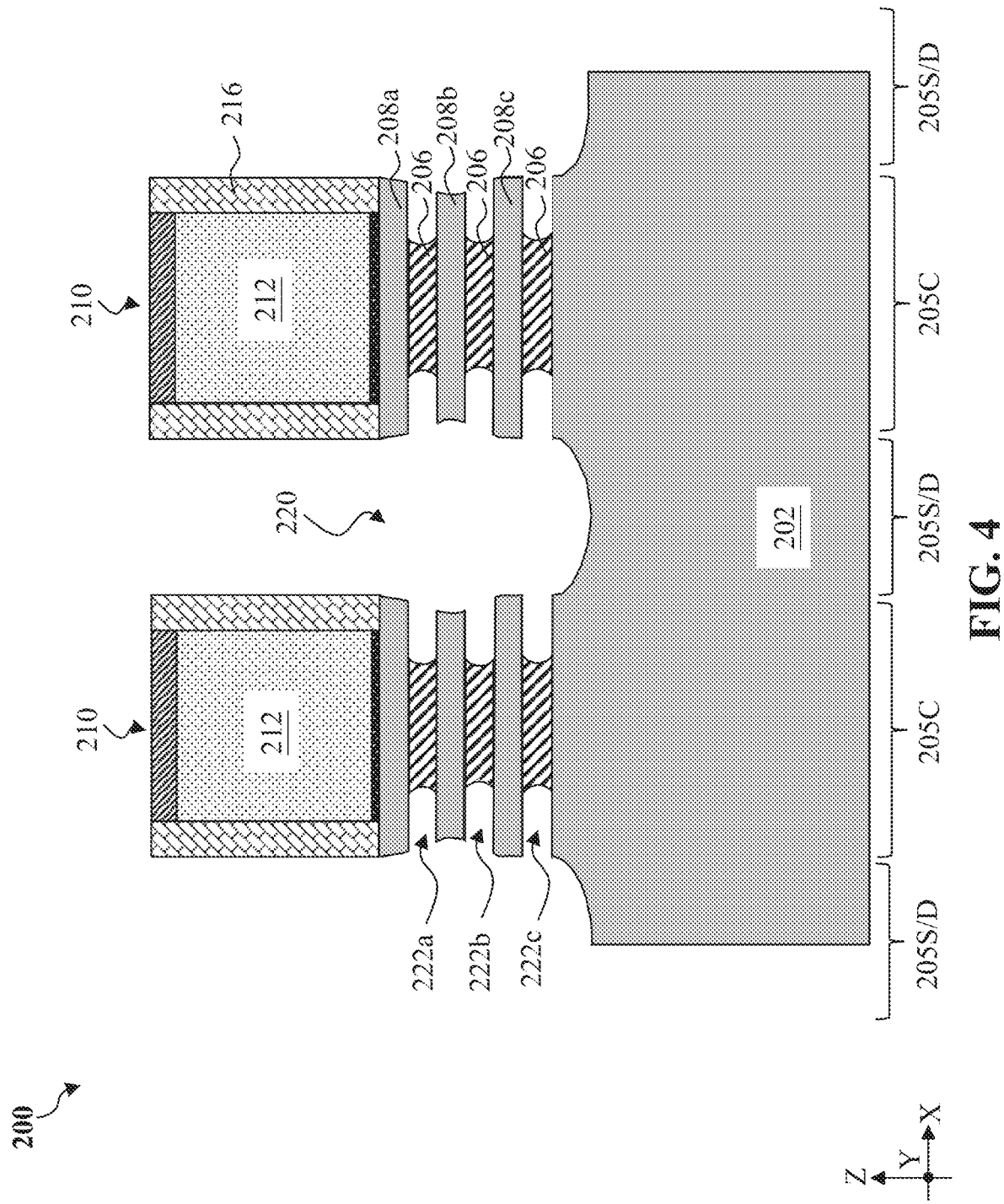

Referring to FIGS. 1 and 4, method 100 includes a block 106 where inner spacer recesses 222a, 222b, 222c are formed. At block 106, the sacrificial layers 206 exposed in the source/drain opening 220 are selectively and partially recessed to form inner spacer recesses (such as inner spacer recesses 222a, 222b, 222c). In an embodiment where the channel layers 208 consist essentially of silicon (Si) and sacrificial layers 206 consist essentially of silicon germanium (SiGe), the selective and partial recess of the sacrificial layers 206 may be a selective isotropic etching process (e.g., a selective dry etching process or a selective wet etching process), and the extent at which the sacrificial layers 206 are recessed is controlled by duration of the etching process. The selective dry etching process may include use of one or more fluorine-based etchants, such as fluorine gas or hydrofluorocarbons. The selective wet etching process may include a hydro fluoride (HF) or $NH_4OH$ etchant. In some embodiments, the channel layers 208 may be moderately etched at block 106 and the inner spacer recesses 222a, 222b, 222c may partially extend along the Z direction into the channel layers 208. Due to the profile of the sidewall 220S, each of the inner spacer recesses 220a, 220b, and 220c may have a different depth along the X direction. For example, a depth of the inner spacer recess 222b is greater than a depth of the inner spacer recess 222a and a depth of the inner spacer recess 222c. Put differently, a length (along the X direction) of the sacrificial layer 206 disposed between the channel layer 208b and the channel layer 208c may be smaller than the lengths of the other two sacrificial layers 206.

Figure 5:
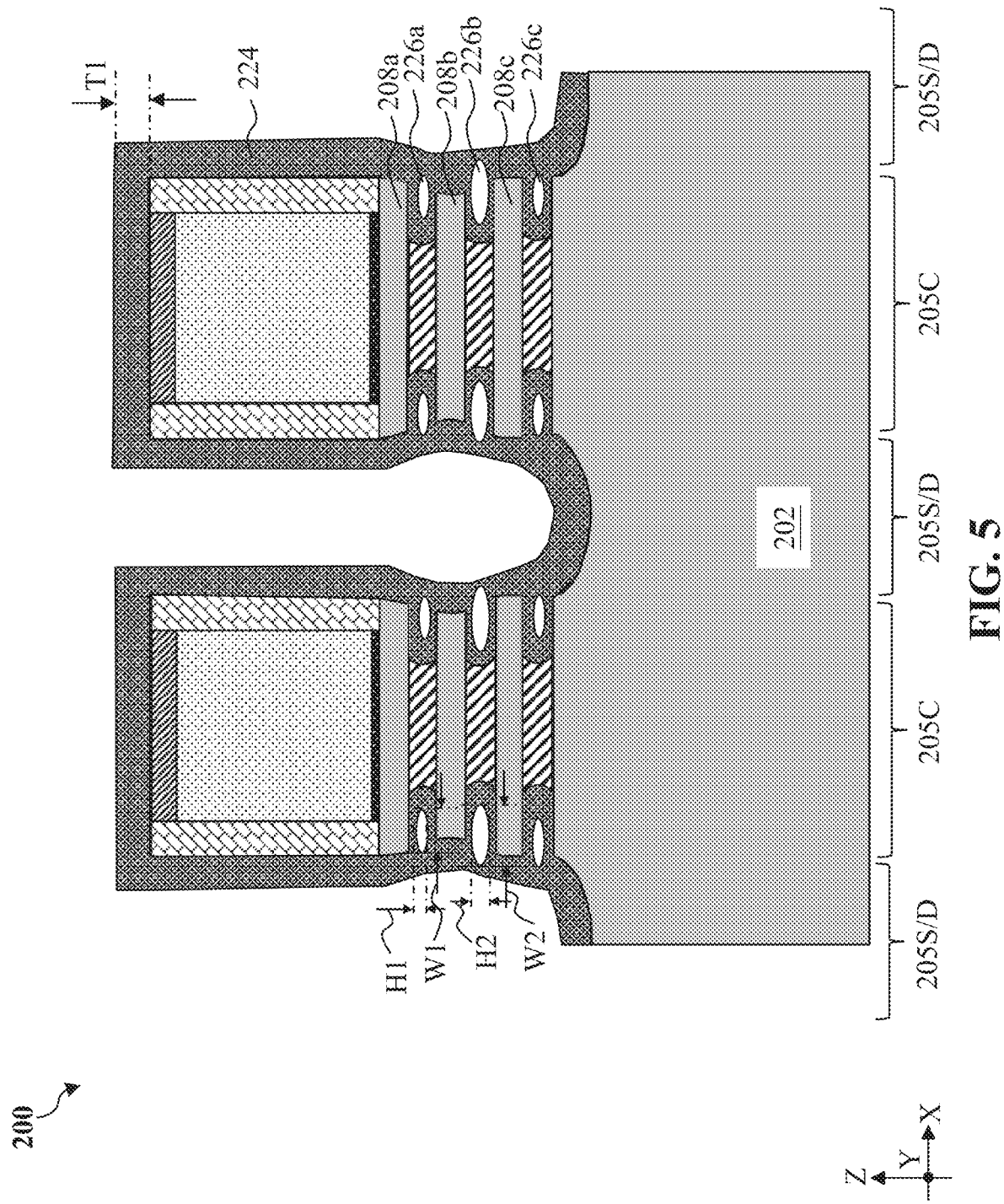

Referring to FIGS. 1 and 5, method 100 includes a block 108 where a spacer material layer 224 is formed over the workpiece 200. The spacer material layer 224 may be deposited using ALD, CVD, other suitable processes and may include silicon (Si), carbon (C), oxygen (O), and/or nitrogen (N). In some embodiments, the spacer material layer 224 may include silicon nitride, silicon oxycarbide, silicon oxycarbonitride, silicon carbonitride, metal nitride, or a suitable dielectric material. The spacer material layer 224 is deposited to a thickness T1 between about 2 nm and about 10 nm. The thickness T1 of the spacer material layer 224 is selected such that it is sufficiently thick to prevent damages to the to-be-formed source/drain features during channel release process and at the same time, is thin enough to facilitate the formation of satisfactory air gaps (i.e., voids or seams) to significantly reduce the parasitic capacitance of the workpiece 200. Due to the aspect ratios of the inner spacer recesses 222a, 222b, and 222c, voids (i.e., seams or air gaps) 226a, 226b, and 226c are formed during the deposition of the spacer material layer 224. The aspect ratio of the inner spacer recess may be referred to as a ratio of the dimension of the inner spacer recess in X direction to the dimension of the inner spacer recess in Z direction. The voids 226a, 226b, and 226c are sealed by the spacer material layer 224. In embodiments represented in FIG. 5, due to the dimensional relationship among the inner spacer recesses 222a, 222b and 222c (inner spacer recesses 222a-222c), the aspect ratio of the inner spacer recess 222b is greater than the aspect ratio of the inner spacer recess 222a and the aspect ratio of the inner spacer recess 222c, and thus, a volume of the void 226b is greater than a volume of the void 226a and a volume of the void 226c. For example, the void 226a may span a height H1 along the Z direction and a width W1 along the X direction, and the void 226b may span a height H2 that is greater than H1 and span a width W2 that is greater than W1. In an embodiment, the dimensions of the void 226c may be similar to those of the void 226b. In another embodiment, the dimensions of the void 226c may be similar to those of the void 226a.

Figure 6:
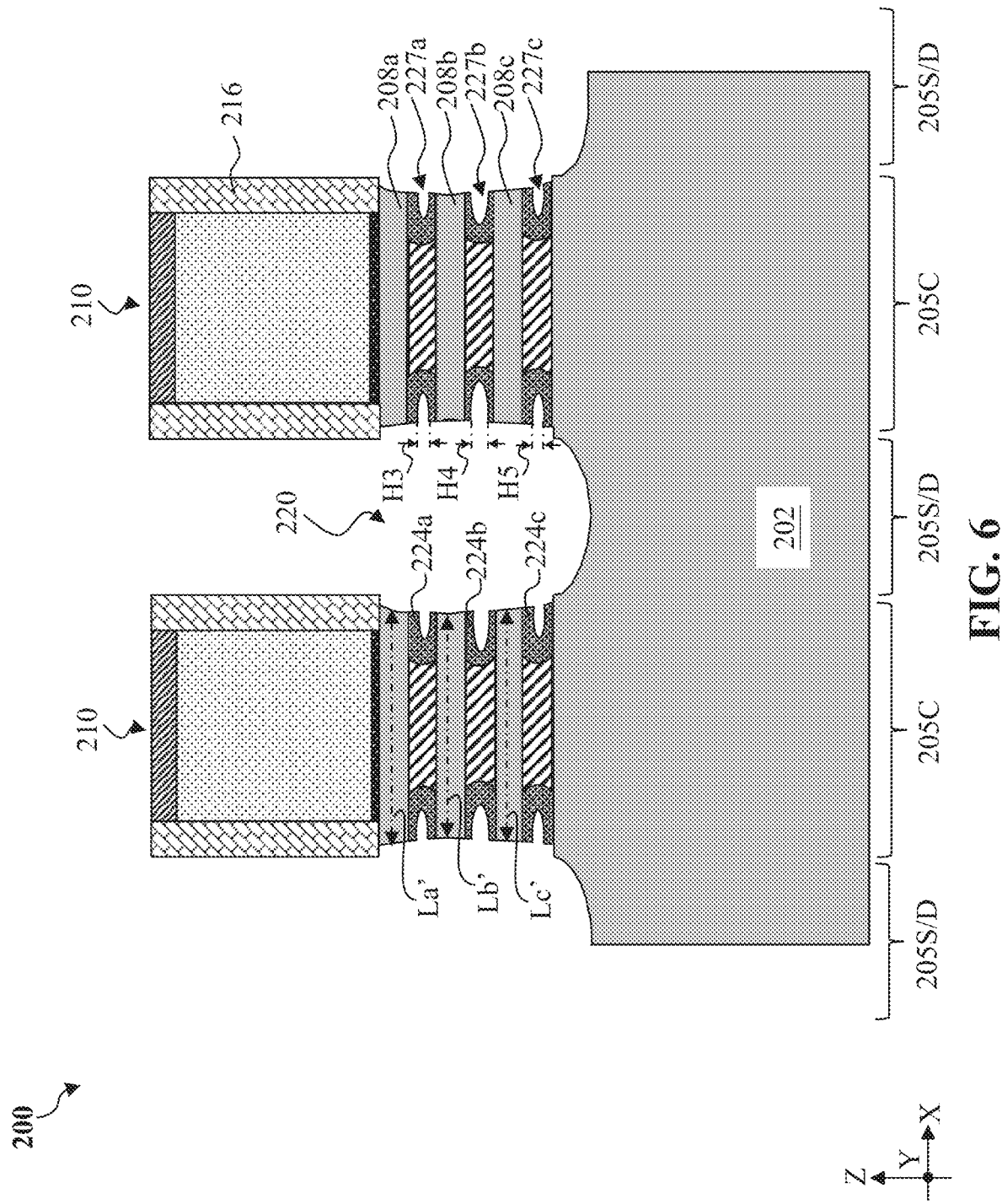

Referring to FIGS. 1 and 6, method 100 includes a block 110 where the spacer material layer 224 is etched back to form dielectric layers (such as dielectric layers 224a, 224b, and 224c) that partially fill the inner spacer recesses (such as the inner spacer recesses 222a-222c shown in FIG. 4), respectively. At block 110, the etch back process removes the spacer material layer 224 on the channel layers 208, the substrate 202, and the gate spacer layer 216 to form the dielectric layers 224a, 224b, and 224c (224a-224c) in the inner spacer recesses 222a-222c, respectively. In the present embodiment, portions of the spacer material layer 224 that seal the voids 226a, 226b, and 226c are also removed by the etch back process, leading to trenches 227a, 227b, and 227c, respectively. The trench 227a is spaced apart from the channel layers 208a-208b and the sacrificial layer 206 by the dielectric layer 224a, the trench 227b is spaced apart from the channel layers 208b-208c and the sacrificial layer 206 by the dielectric layer 224b, and trench 227c is spaced apart from the channel layer 208c, the substrate 202, and the sacrificial layer 206 by the dielectric layer 224c. The trench 227a spans a height H3 along the Z direction, the trench 227b spans a height H4 along the Z direction, and the trench 227c spans a height H5 along the Z direction. In embodiments represented in FIG. 6, the height H4 is greater than the height H3 and the height H5. In an embodiment, each of the height H3, the height H4, and the height H5 may be less than about 5 nm.

In some embodiments, the etch back process at block 110 may be a dry etch process that includes use of an oxygen-containing gas, hydrogen, nitrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas (e.g., $CF_3I$), other suitable gases and/or plasmas, and/or combinations thereof. It is noted that, the etch back process at block 110 also slightly etches the channel layers 208a, 208b, and 208c. After the etch back process at block 110, the channel layer 208a has a length La' along the X direction, the channel layer 208b has a length Lb' along the X direction, and the channel layer 208c has a length Lc' along the X direction. The length Lc' is greater than the length La', and the length La' is greater than the length Lb'. That is, Lc'>La'>Lb'. Accordingly, the gate spacer layer 216 overhangs each of the channel layers 208a-208c. It is further noted that, the etch back process employed in block 110 may also cause defects (e.g., dangling bonds) on surfaces of the dielectric layers 224a-224c exposed by the source/drain opening 220.

Figure 7:
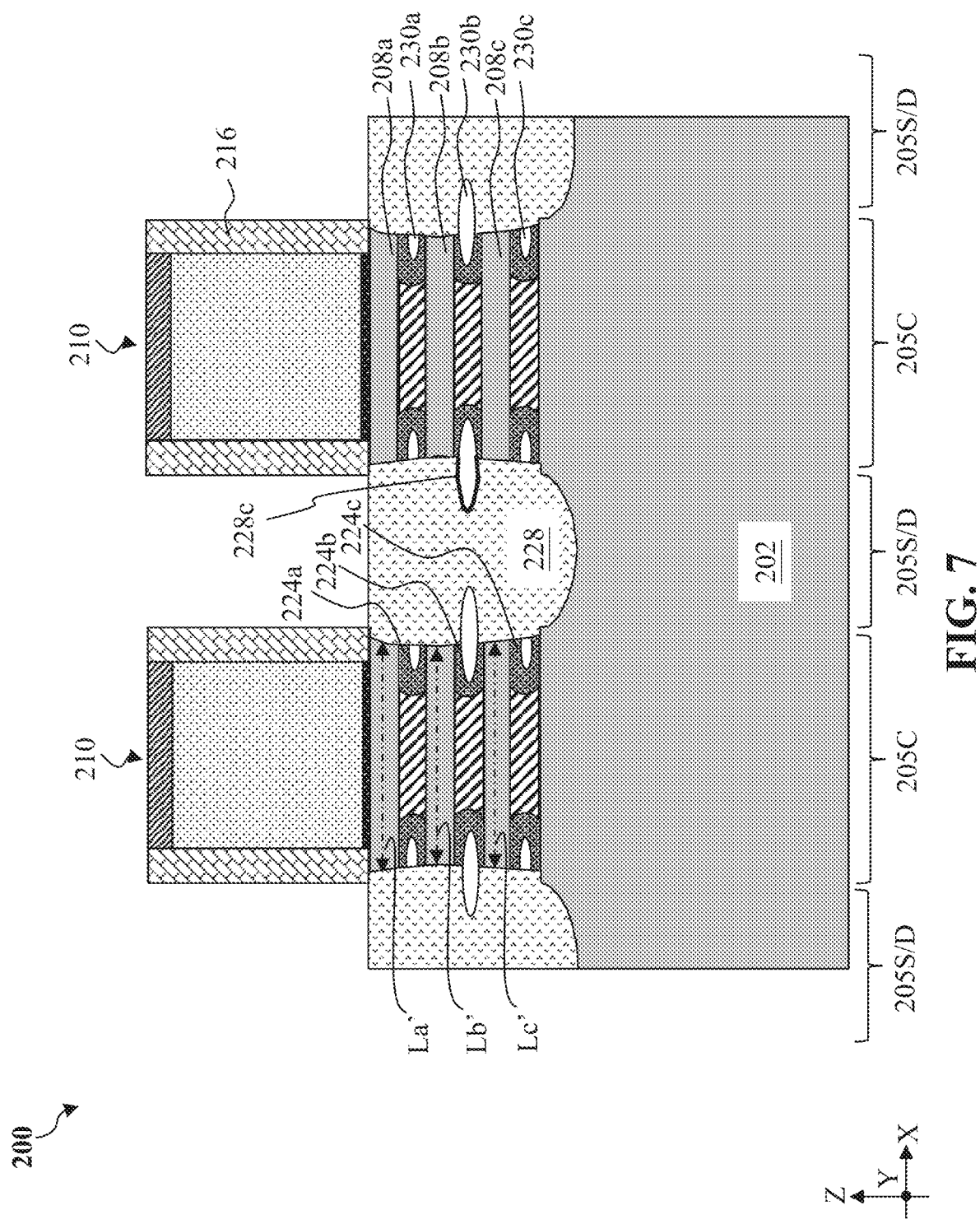

Referring to FIGS. 1 and 7, method 100 includes a block 112 where a source/drain feature 228 is formed in the source/drain opening 220. In some embodiments, the source/drain feature 228 may be formed using an epitaxial process, such as VPE, UHV-CVD, MBE, and/or other suitable processes. The epitaxial growth process may use gaseous and/or liquid precursors, which interact with the composition of the substrate 202 as well as the channel layers 208 without interacting with the dielectric layers 224a-224c or the trenches 227a-227c surrounded by the dielectric layers 224a-224c. Since the precursors used in the epitaxial growth process does not interact with the dielectric layers 224a-224c or the trenches 227a-227c, voids (i.e., air gaps or seams) 230a, 230b, and 230c are formed in the workpiece 200. More specifically, surfaces of the dielectric layer 224a that are exposed in the source/drain opening 220 include dangling bonds to which the precursors of the epitaxial growth process may be attached. Precursors may be attached to first dangling bonds on the sidewall surface of the upper portion of the dielectric layer 224a (i.e., the portion of the dielectric layer 224a above the trench 227a) and second dangling bonds on the sidewall surface of the lower portion of the dielectric layer 224a (i.e., the portion of the dielectric layer 224a under the trench 227a). Due to the dimension of the height H3, during the epitaxial growth process of the source/drain feature 228, an epitaxial region formed associated with the first dangling bonds may merge with an epitaxial region formed associated with the second dangling bonds to seal the trench 227a and form the void 230a. The void 230a is disposed between the channel layers 208a and 208b without extending into the source/drain feature 228. The void 230c may be formed in a way similar to the void 230a.

Due to the dimension of the height H4 of the trench 227b, the void 230b that has a volume greater than the volume of the void 230a is formed between the channel layers 208b and 208c. An epitaxial region formed associated with the channel layer 208b, an epitaxial region formed associated with the channel layer 208c, and an epitaxial region formed associated with the substrate 202 merge to form the void 230b. Upon conclusion of the operations at block 116, the void 230b extends into the source/drain feature 228. That is, the sidewall of the source/drain feature 228 includes a curvature surface, and a portion 228c of the curvature surface of the source/drain feature 228 curves inward. In other words, the portion 228c of the curvature surface bends towards the source/drain feature 228 feature and away from the channel region 205C. Other portions of the curvature surface of the source/drain feature 228 may slightly curve outward, due to the length relationships of the channel layers 208a-208c.

Figure 8:
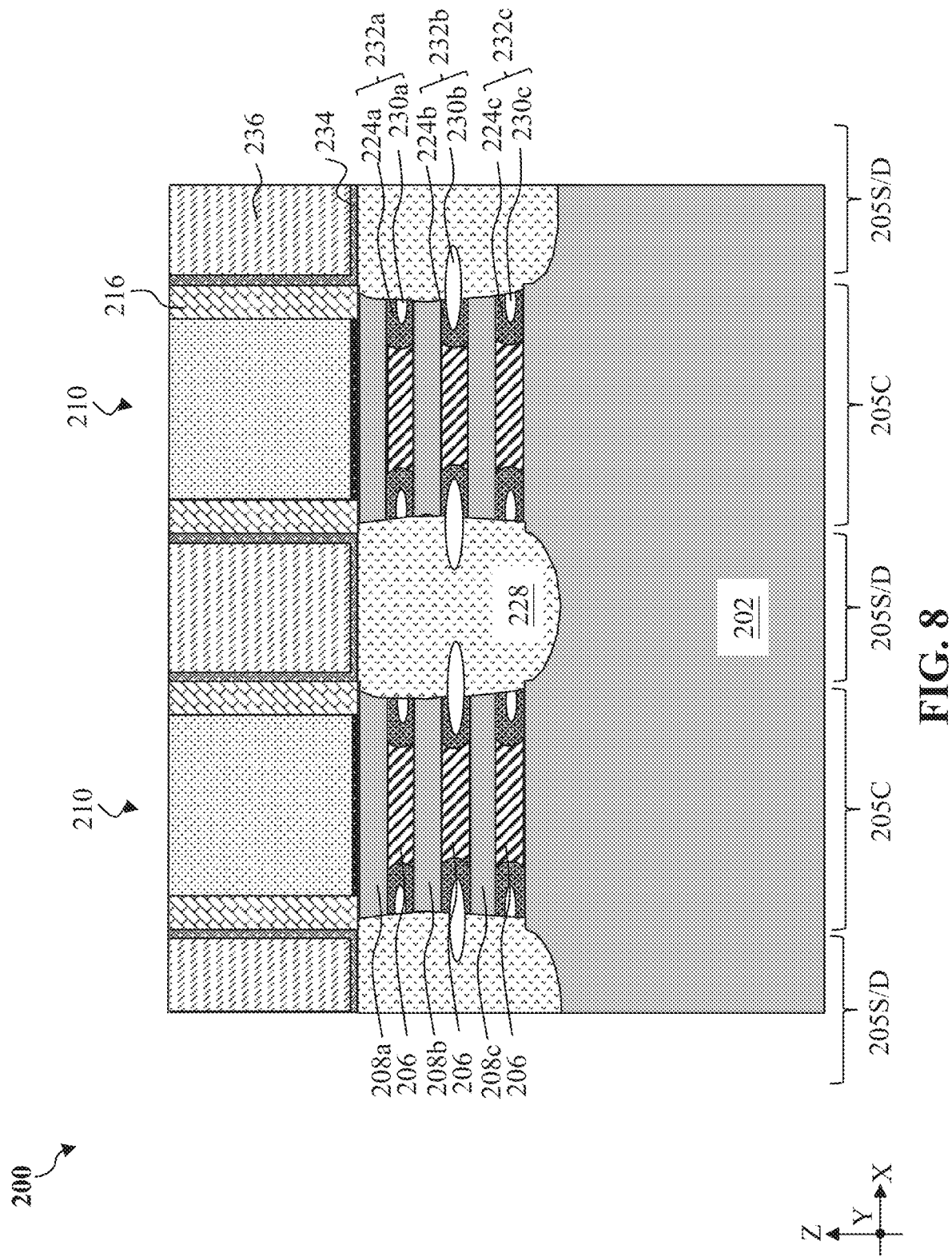

The dielectric layer 224a and the void 230a may be collectively referred to as an inner spacer feature 232a (shown in FIG. 8), the dielectric layer 224b and the void 230b may be collectively referred to as an inner spacer feature 232b (shown in FIG. 8), and the dielectric layer 224c and the void 230c may be collectively referred to as an inner spacer feature 232c (shown in FIG. 8). Since a dielectric constant of air is smaller than a dielectric constant of the spacer material layer 224, a parasitic capacitance associated with an inner spacer feature having a combination of the spacer material layer 224 and an air gap (e.g., air gap 230b) is smaller than a parasitic capacitance associated with an inner spacer feature that is formed only of the spacer material layer 224. That is, due to the formation of the voids 230a-230c, a parasitic capacitance between the to-be-formed gate structure 242 (shown in FIG. 10) and the source/drain feature 228 may be advantageously reduced. In addition, the parasitic capacitance between the gate structure 242 (shown in FIG. 10) and the source/drain feature 228 is also a function of a thickness of the inner spacer feature (along the X direction). Forming the void 230b that extends into the source/drain feature 228 increases the thickness of the inner spacer feature 232b and further reduces the parasitic capacitance of the workpiece 200.

Depending on the conductivity type of the to-be-formed MBC transistor, the source/drain features 228 may be n-type source/drain features or p-type source/drain features. Exemplary n-type source/drain features may include silicon, phosphorus-doped silicon, arsenic-doped silicon, antimony-doped silicon, or other suitable material and may be in-situ doped during the epitaxial process by introducing an n-type dopant, such as phosphorus, arsenic, or antimony, or ex-situ doped using a junction implant process. Exemplary p-type source/drain features may include germanium, gallium-doped silicon germanium, boron-doped silicon germanium, or other suitable material and may be in-situ doped during the epitaxial process by introducing a p-type dopant, such as boron or gallium, or ex-situ doped using a junction implant process.

Referring to FIGS. 1 and 8, method 100 includes a block 114 where a contact etch stop layer (CESL) 234 and an interlayer dielectric (ILD) layer 236 are deposited over the workpiece 200. The CESL 234 may include silicon nitride, silicon oxynitride, and/or other materials known in the art and may be formed by ALD, plasma-enhanced chemical vapor deposition (PECVD) process and/or other suitable deposition or oxidation processes. As shown in FIG. 8, the CESL 234 may be deposited on top surfaces of the source/drain feature 228 and sidewalls of the gate spacer layer 216. The ILD layer 236 is deposited by a PECVD process or other suitable deposition technique over the workpiece 200 after the deposition of the CESL 234. The ILD layer 236 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, after formation of the ILD layer 236, the workpiece 200 may be annealed to improve integrity of the ILD layer 236. FIG. 8 shows an embodiment where the gate-top hard mask layer 213 and excess materials over the gate-top hard mask layer are removed (e.g., by a planarization process such as CMP) after the deposition of the CESL 234 and the ILD layer 236. In embodiments represented in FIG. 8, a portion of the void 230b is disposed directly under the gate spacer layer 216 and the dummy gate stack 210, and a rest of the void 230b is disposed directly under the CESL 234 and the ILD layer 236.

Figure 9:
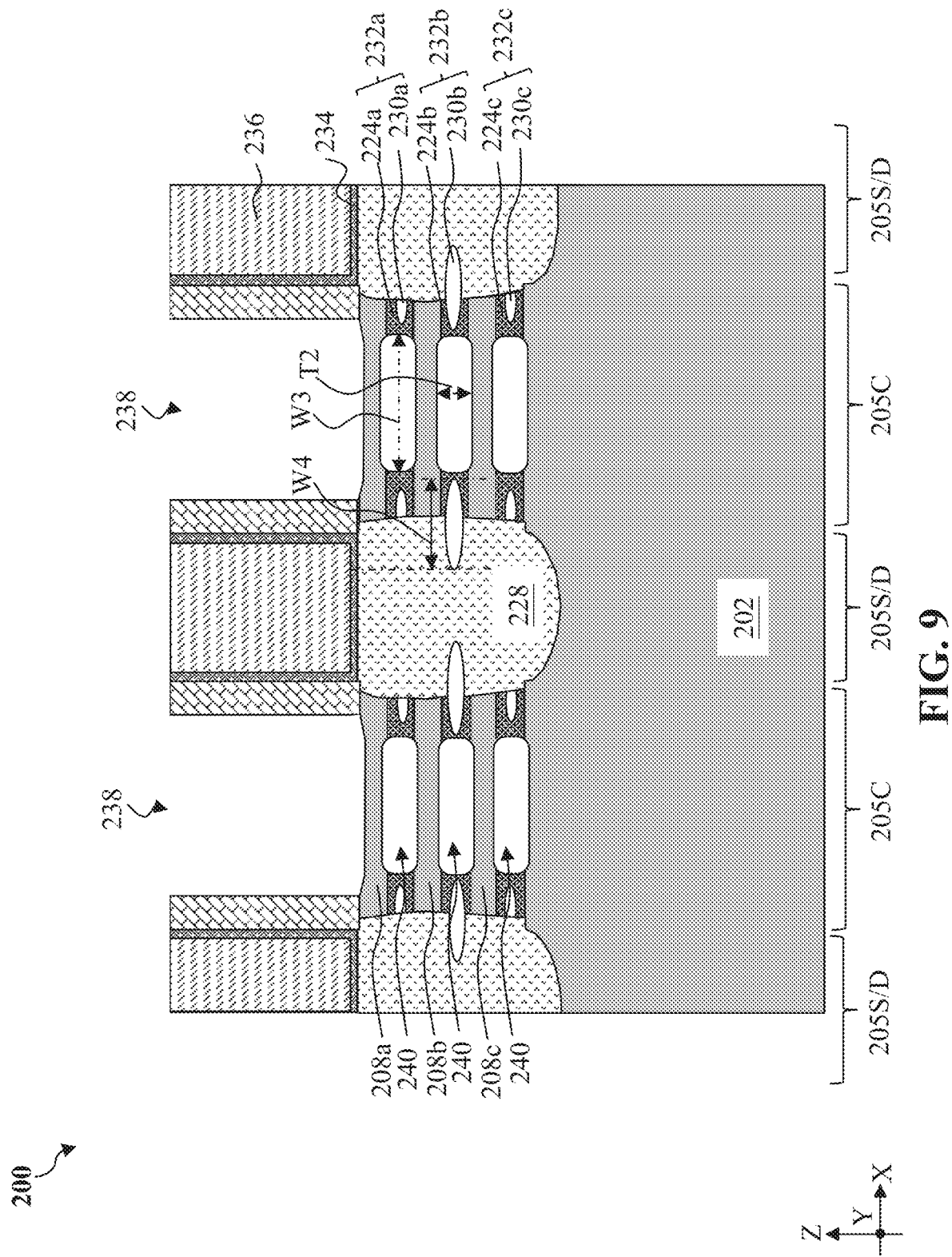

Referring to FIGS. 1 and 9, method 100 includes a block 116 where the dummy gate stacks 210 and the sacrificial layers 206 are removed. With the exposure of the dummy gate electrode layer 212, block 116 proceeds to the removal of the dummy gate stacks 210. The removal of the dummy gate stacks 210 may include one or more etching process that are selective to the material in the dummy gate stacks 210. For example, the removal of the dummy gate stacks 210 may be performed using a selective wet etch, a selective dry etch, or a combination thereof. The removal of the dummy gate stack 210 results in a gate trench 238 over the channel regions 205C. A gate structure may be subsequently formed in the gate trench 238, as will be described below. Sidewalls of the channel layers 208 and sacrificial layers 206 in the channel regions 205C are exposed in the gate trench 238.

After the removal of the dummy gate stacks 210, the sacrificial layers 206 are selectively removed to release the channel layers 208 as channel members 208 in the channel regions 205C. The selective removal of the sacrificial layers 206 may be referred to as a channel release process and may be implemented by a selective dry etch, a selective wet etch, or other selective etching process. In some embodiments, the selective wet etching includes an APM etch (e.g., ammonia hydroxide-hydrogen peroxide-water mixture). As shown in FIG. 9, although the removal of the sacrificial layers 206 at block 116 is selective, it may still moderately etch the channel members 208, reducing thicknesses of the channel members 208 along the Z direction. Thus, a thickness (along the Z direction) of each of the channel members 208 of the present disclosure may be not uniform throughout its length along the X direction. This selective removal of the sacrificial layers 206 form inter-member openings 240 in the channel region 205C. When viewed from the Y direction, each of the inter-member openings 240 has a racetrack-like shape. In some embodiments, the selective etching of the sacrificial layers 206 may also slightly etch the dielectric layers 224a-224c adjacent to the inter-member openings 240 without exposing the voids 230a, 230b and 230c. The inter-member opening 240 spans a width W3 along the X direction and spans a height T2 along the Z direction. The void 230b spans a width W4 along the X direction. In an embodiment, a ratio of the width W4 to the width W3 (i.e., W4/W3) may be between about 0.2 and about 1.5 to significantly reduce a parasitic capacitance between the to-be-formed gate structure 242 and the source/drain feature 228 while ensuring that the inter-member opening 240 is large enough for forming the satisfactory gate structure 242.

Figure 10:
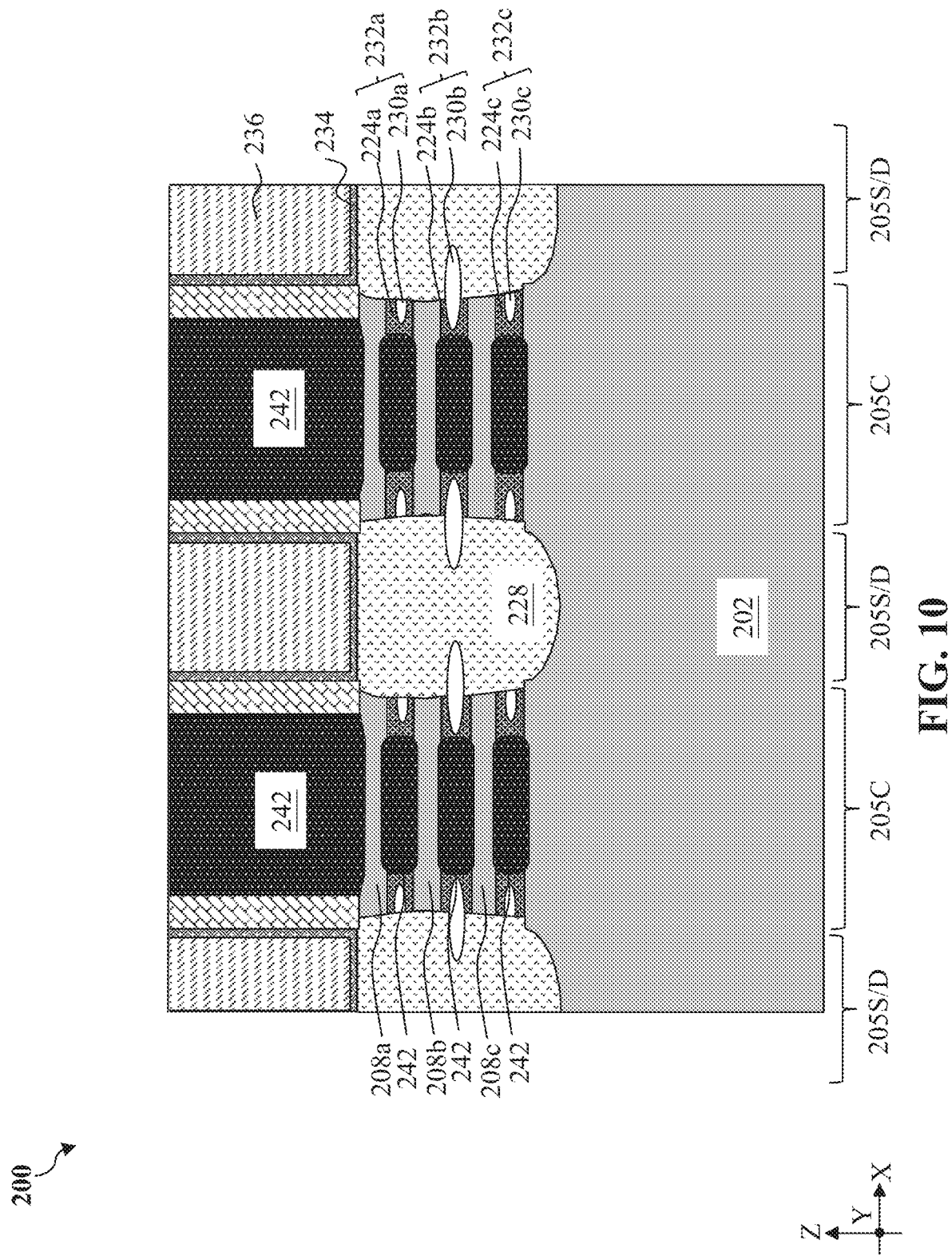

Referring to FIGS. 1 and 10, method 100 includes a block 118 where a gate structure 242 is formed over the workpiece 200. As shown in FIG. 10, the gate structure 242 is formed within the gate trench 238 (shown in FIG. 9) and is deposited in the inter-member openings 240 left behind by the removal of the sacrificial layers 206 in the channel regions 205C. In this regard, the gate structure 242 wraps around each of the channel members 208 on the Y-Z plane. In some embodiments, although not explicitly shown, the gate structure 242 includes a gate dielectric layer and a gate electrode formed over the gate dielectric layer.

In some embodiments, the gate dielectric layer may include an interfacial layer and a high-K dielectric layer. High-K gate dielectrics, as used and described herein, include dielectric materials having a high dielectric constant, for example, greater than that of thermal silicon oxide (~3.9). The interfacial layer may include a dielectric material such as silicon oxide, hafnium silicate, or silicon oxynitride. The interfacial layer may be deposited using chemical oxidation, thermal oxidation, ALD, CVD, and/or other suitable method. The high-K dielectric layer may include hafnium oxide ($HfO_2$), titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HMO), hafnium titanium oxide (HfTiO), $(Ba,Sr)TiO_3$ (BST), silicon nitride (SiN), silicon oxynitride (SiON), combinations thereof, or other suitable materials. The high-K dielectric layer may be formed by ALD, physical vapor deposition (PVD), CVD, oxidation, and/or other suitable methods.

The gate electrode of the gate structure 242 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. In various embodiments, the gate electrode may be formed by ALD, PVD, CVD, e-beam evaporation, or other suitable process. Further, the gate electrode may be formed separately for n-type transistors and p-type transistors, which may use different metal layers (e.g., for providing different n-type and p-type work function metal layers). In various embodiments, a planarization process, such as a CMP process, may be performed to remove excess materials for both the gate dielectric layer and the gate electrode, thereby providing a substantially planar top surface of the gate structure 242.

The portion of the gate structure 242 that is formed in the gate trench 238 may be referred to as an outer gate structure 242, and the portion of the gate structure 242 that is formed in the inter-member openings 240 may be referred to as an inner gate structure 242. The outer gate structure 242 may overhang the inner gate structure 242. Since the inner gate structure 242 fills the inter-member opening 240, the inner gate structure 242 tracks the shape pf the inter-member openings 240 and thus has a width W3 and a thickness T2. In some embodiments, since the dielectric layers 224a-224c of the inner spacer features 232a-232c are exposed in the inter-member openings 240 (shown in FIG. 9), the inner gate structure 242 is in contact with the dielectric layers 224a-224c and spaced apart from the voids 230a-230c by the dielectric layers 224a-224c.

Figure 11:
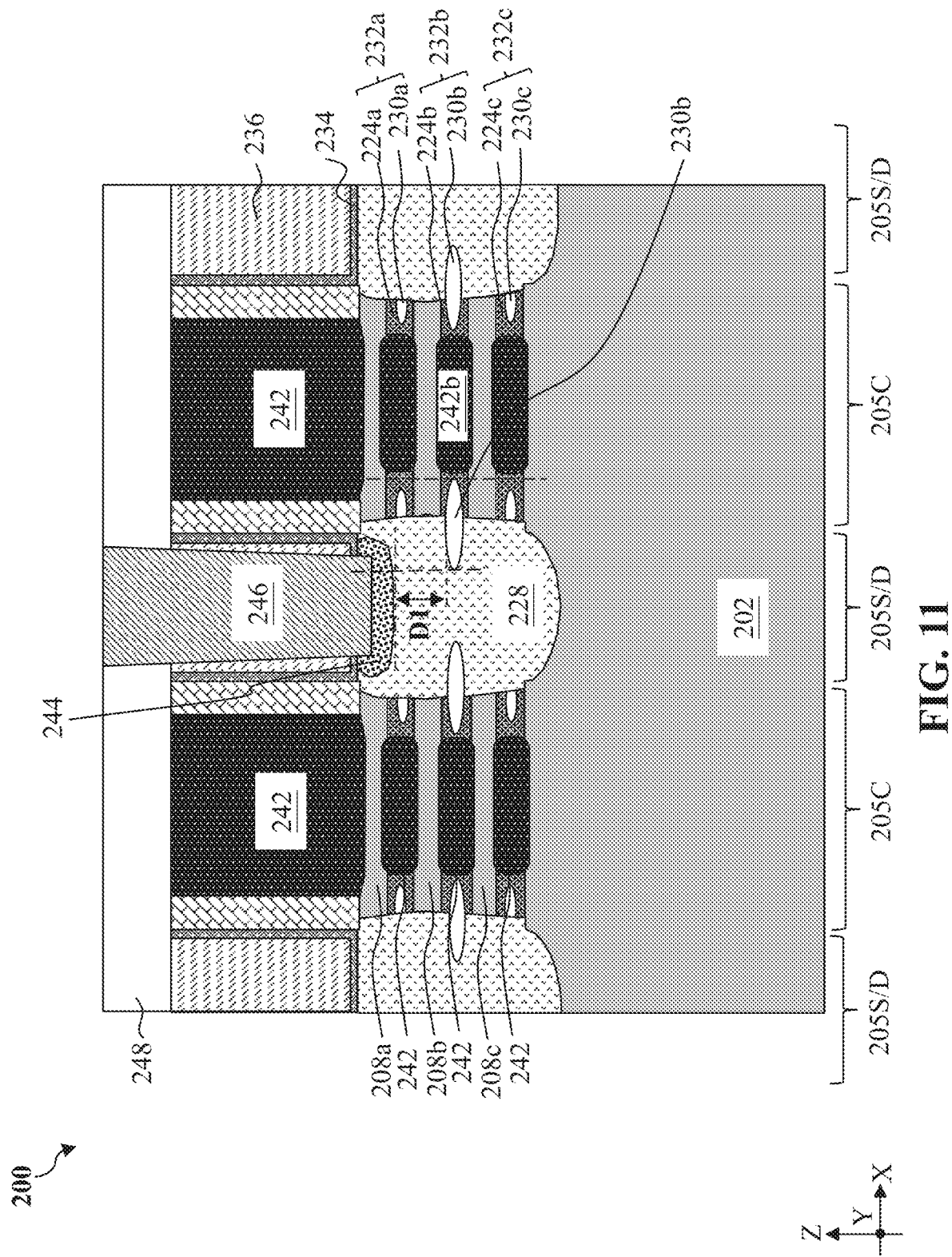

Referring to FIGS. 1 and 11, method 100 includes a block 120 where a silicide layer 244 and a source/drain contact 246 are formed over the source/drain feature 228. As shown in FIG. 11, an interlayer dielectric (ILD) layer 248 may be formed over the workpiece 200. The formation and composition of the ILD layer 248 may be in a way similar to those of the ILD layer 236. The ILD layer 248, the ILD layer 236, and the CESL 234 may be patterned to form a source/drain contact opening exposing the source/drain feature 228. A conductive material is subsequently deposited in the source/drain contact opening using any suitable method, such as CVD, ALD, PVD, plating, and/or other suitable processes. In some embodiments, a silicide layer 244 is formed between the source/drain feature 228 and the source/drain contact 246. A bottom surface of the silicide layer 244 may have a curvature. The silicide layer 244 may include nickel silicide, cobalt silicide, tungsten silicide, tantalum silicide, titanium silicide, platinum silicide, erbium silicide, palladium silicide, other suitable silicide, or combinations thereof. The silicide layer 244 may be formed over the source/drain feature 228 by a series of deposition, thermal, and etching processes. The source/drain contact 246 may include any suitable conductive material, such as Co, W, Ru, Cu, Al, Ti, Ni, Au, Pt, Pd, and/or other suitable conductive materials.

A distance between the silicide layer 244 and the void 230b may be referred to as D1. In an embodiment, a ratio of the distance D1 to the height T2 (i.e., D1/T2, T2 shown in FIG. 9) may be between about 0.5 and about 3. In some embodiments, the distance D1 may be between about 5 nm and about 15 nm. In embodiments represented in FIG. 11, the void 230b includes a first portion disposed directly under the source/drain contact 246, and a second portion disposed directly under the outer gate structure 242. In embodiments represented in FIG. 11, an entirety of the void 230a is disposed directly between the channel member 208a and the channel member 208b and does not extend into the source/drain feature 228, thereby reducing the risk of forming an unsatisfactory silicide layer 244 and thus reducing the risk of increasing a parasitic resistance of the workpiece 200.

Still Referring to FIGS. 1 and 11, method 100 includes a block 122 where further processes may be performed to complete the fabrication of the semiconductor device 200. Such further process may include forming a multi-layer interconnect (MLI) structure (not depicted) thereover and/or a power rail thereunder. The MLI may include various interconnect features, such as vias and conductive lines, disposed in dielectric layers, such as ESLs and ILD layers. In some embodiments, the vias are vertical interconnect features configured to interconnect a device-level contact, such as a gate contact (not depicted), a conductive line, or interconnect different conductive lines, which are horizontal interconnect features. The ESLs and the ILD layers of the MLI may have substantially the same compositions as those described above with respect to the CESL 234 and the ILD layer 236, respectively. The vias and the conductive lines may each include any suitable conductive material, such as Co, W, Ru, Cu, Al, Ti, Ni, Au, Pt, Pd, a metal silicide, other suitable conductive materials, or combinations thereof, and be formed by a series of patterning and deposition processes. Additionally, each via and conductive line may additionally include a barrier layer that includes TiN and/or TaN.

Figure 12:
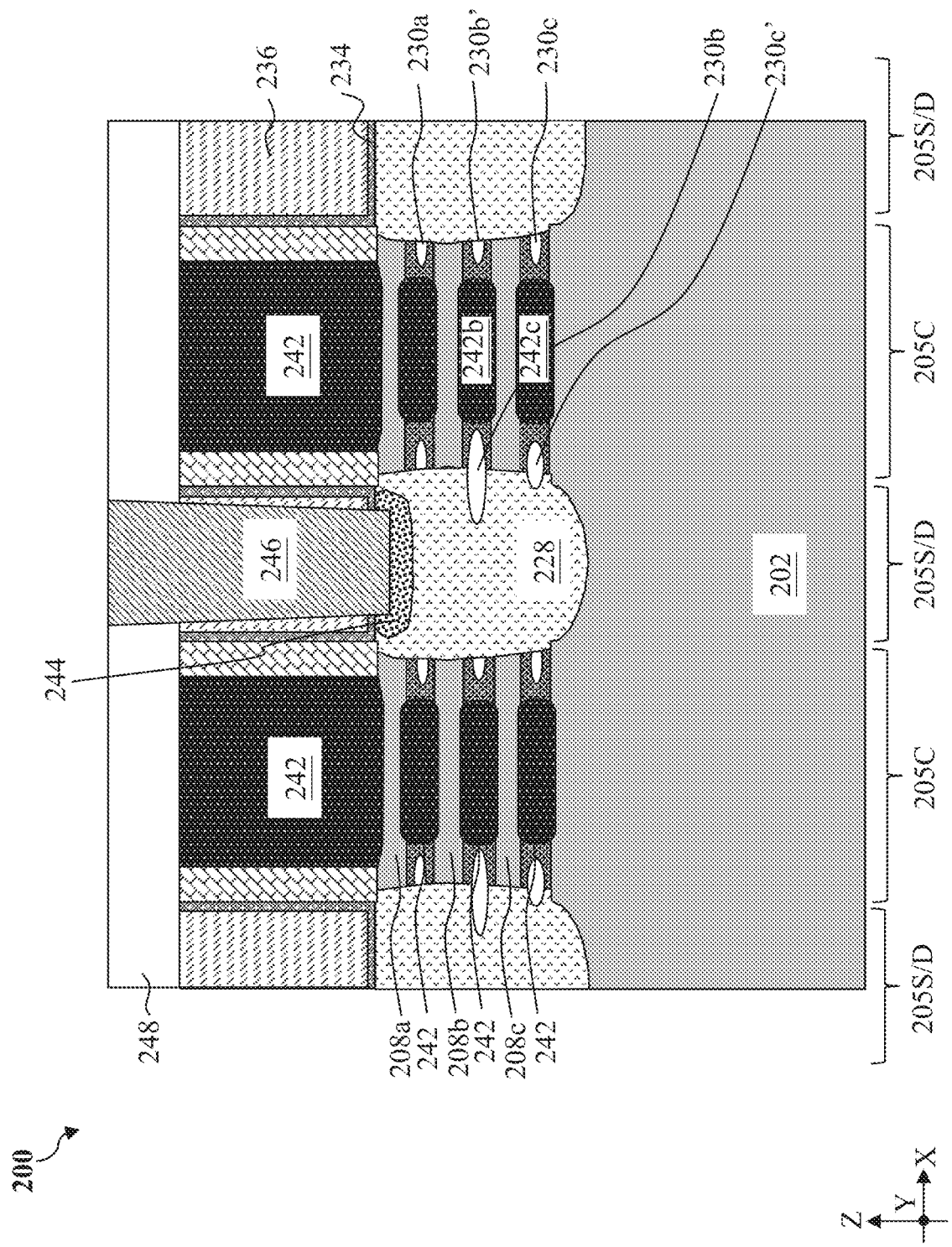

In the embodiments described above, the workpiece 200 has substantially symmetric inner spacer features. For example, as shown in FIG. 11, the void 230b of the inner spacer feature 232b that is formed on the left side of the inner gate structure 242b is substantially same to the void 230b that is formed on the right side of the inner gate structure 242b. In some other implementations, the inner spacer features that are formed on opposite sides of an inner gate structure in a GAA transistor may not be symmetric. FIG. 12 depicts an embodiment where the workpiece 200 includes asymmetric inner spacer features. For example, as shown in FIG. 12 which is a fragmentary cross-sectional view, the workpiece 200 includes the void 230b disposed on a left side of the inner gate structure 242b and a void 230b' disposed on a right side of the inner gate structure 242b, and a volume of the void 230b is greater than a volume of the void 230b'. In embodiments represented in FIG. 12, the workpiece 200 also includes the void 230c disposed on a right side of an inner gate structure 242c and a void 230c' disposed on a left side of the inner gate structure 242c, and a volume of the void 230c' is greater than a volume of the void 230c and a volume of the void 230a. In the present embodiment, the volume of the void 230b is greater than the volume of the void 230c', and both the void 230b and the void 230c' extend into the source/drain feature 228. The formation of the void 230a is intentionally controlled such that it does not extend into the source/drain feature 228, thereby reducing the risk of forming an unsatisfactory silicide layer 244. The void 230b and the void 230c' are formed on a same side of the inner gate structures 242b-242c. In some other implementations, the void 230b and the void 230c' may be formed on opposite sides of the inner gate structures 242b-242c.

It is noted that, in the embodiments described above with reference to FIGS. 1-12, three layers of the sacrificial layers 206 and three layers of the channel layers 208 (208a-208c) are alternately and vertically arranged as illustrated in FIG. 2, which are for illustrative purposes only and not intended to limit the present disclosure to what is explicitly illustrated therein. It is understood that any number of sacrificial layers 206 and channel layers 208 can be formed in the vertical stack 207. The number of layers depends on the desired number of channels members 208 for the semiconductor device 200. In some embodiments, the number of the channel layers 208 is between 2 and 10. The number of inner spacer features is for illustrative purposes only and not intended to limit the present disclosure to what is explicitly illustrated therein. In some embodiments, the workpiece 200 shown in FIG. 2 may include four channel layers 208 (e.g., a topmost channel layer, a $2^{nd}$ channel layer under the topmost channel layer, a $3^{rd}$ channel layer under the $2^{nd}$ channel layer, and a bottommost channel layer) interleaved by four sacrificial layers 206, and the $2^{nd}$ channel layer and the $3^{rd}$ channel layer may be etched to have a shorter length than the topmost channel layer and the bottommost channel layer by tuning the etching process 218. Accordingly, the inner spacer features disposed directly between the $2^{nd}$ channel layer and the $3^{rd}$ channel layer, and/or the inner spacer features disposed directly between the $3^{rd}$ channel layer and the bottommost channel layer may include air gaps having larger volumes than air gaps of other inner spacer features and may extend into the source/drain feature.

Embodiments of the present disclosure provide many benefits to a semiconductor device and the formation thereof, though it is understood that other embodiments may offer different advantages, not all advantages are necessarily discussed herein, and no particular advantage is required for all embodiments. In some embodiments of the present disclosure, inner spacers include air gaps for reducing effective dielectric constant. Further, some of the airgaps may extend into source/drain features, which provides a benefit of reducing a gate-to-drain capacitance and a gate-to-source capacitance of multi-gate devices. Therefore, the performance (e.g., speed) of the semiconductor device may be further improved.

The present disclosure provides for many different embodiments. Semiconductor devices and methods of fabrication thereof are disclosed herein. In one exemplary aspect, the present disclosure is directed to a semiconductor device. The semiconductor device includes a vertical stack of channel members disposed over a substrate, a gate structure wrapping around each channel member of the vertical stack of channel members, and a source/drain (S/D) feature disposed over the substrate and coupled to the vertical stack of channel members. The source/drain feature is spaced apart from a sidewall of the gate structure by a first air gap and a first dielectric layer, and the first air gap extends into the source/drain feature.

In some embodiments, the vertical stack of channel members may include a first channel member disposed directly over a second channel member and spaced apart from the second channel member by the first dielectric layer and a portion of the first air gap. In some embodiments, the second channel member may be spaced apart from the substrate by a second dielectric layer and a second air gap, and a volume of the first air gap may be different than a volume of the second air gap. In some embodiments, the volume of the first air gap may be greater than the volume of the second air gap. In some embodiments, a length of the second channel member may be greater than a length of the first channel member. In some embodiments, the vertical stack of channel members may also include a topmost channel member disposed directly over the first channel member and spaced apart from the first channel member by a third dielectric layer and a third air gap. In some embodiments, a length of the second channel member may be greater than a length of the topmost channel member, and the length of the topmost channel member may be greater than a length of the first channel member. In some embodiments, a volume of the first air gap may be greater than a volume of the third air gap.

In another exemplary aspect, the present disclosure is directed to a semiconductor device. The semiconductor device includes a substrate, a first nanostructure disposed over and spaced apart from the substrate by a first inner spacer feature, a second nanostructure disposed over and spaced apart from the first nanostructure by a second inner spacer feature, a gate structure wrapping around the first nanostructure and the second nanostructure, and a source/drain (S/D) feature adjacent to the first nanostructure and the second nanostructure. A volume of the second inner spacer feature is greater than a volume of the first inner spacer feature.

In some embodiments, the first inner spacer feature may include a first dielectric layer and a first air gap, and the first air gap may be spaced apart from the gate structure by the first dielectric layer. In some embodiments, the second inner spacer feature may include a second dielectric layer and a second air gap, a volume of the second air gap may be greater than a volume of the first air gap. In some embodiments, the semiconductor device may include a topmost nanostructure disposed over and spaced apart from the second nanostructure by a third inner spacer feature, the third inner spacer feature may include a third air gap spaced apart from the gate structure by a third dielectric layer, and the volume of the second air gap may be greater than a volume of the third air gap. In some embodiments, a sidewall of the source/drain feature facing the gate structure may have a curvature surface in a cross-sectional view perpendicular to a top surface of the substrate, and a portion of the curvature surface may bend towards the source/drain feature and away from the gate structure. In some embodiments, the semiconductor device may include a source/drain contact disposed over the source/drain feature and electrically coupled to the source/drain feature by a silicide layer, and a portion of the second air gap may be disposed directly under the source/drain contact. In some embodiments, the gate structure may include a lower portion sandwiched between the first nanostructure and the second nanostructure, and an upper portion disposed over the topmost nanostructure, a ratio of a distance between the silicide layer and the second air gap to a thickness of the lower portion of the gate structure may be between about 0.5 and about 3. In some embodiments, a ratio of a width of the second air gap to a width of the lower portion of the gate structure may be between about 0.2 and about 1.5.

In yet another exemplary aspect, the present disclosure is directed to a method. The method includes receiving a workpiece that includes a substrate, a vertical stack of semiconductor layers disposed over the substrate, and a dummy gate stack disposed over a channel region of the vertical stack. The vertical stack includes at least three channel layers interleaved by at least three sacrificial layers, and the three channel layers includes a first channel layer disposed over a second channel layer, and a third channel layer disposed under the second channel layer. The method also includes performing an etching process to remove a source/drain region of the vertical stack to form a source/drain trench, the source/drain region is adjacent to the channel region along a first direction, and the source/drain trench exposes sidewalls of the three channel layers and the three sacrificial layers, selectively and partially etching the three sacrificial layers to form inner spacer recesses, depositing a dielectric material layer over the workpiece, etching back the dielectric material layer to form dielectric layers in the inner spacer recesses, the dielectric layers partially fill the inner spacer recesses, forming an epitaxial source/drain feature in the source/drain trench, removing the dummy gate stack, selectively etching the three sacrificial layers to release the three channel layers in the channel region, and forming a gate structure to wrap around each of the three channel layers. After the performing of the etching process, a length of the second channel layer along the first direction is smaller than a length of the first channel layer and a length of the third channel layer.

In some embodiments, the depositing of the dielectric material layer may form a first air gap sealed by the dielectric material layer and disposed between the first channel layer and the second channel layer, and a second air gap sealed by the dielectric material layer and disposed between the second channel layer and the third channel layer. A volume of the second air gap may be greater than a volume of the first air gap. In some embodiments, after releasing the three channel layers, the first channel layer may be spaced apart from the second channel layer by a first inner spacer feature, and the second channel layer may be spaced apart from the third channel layer by a second inner spacer feature. In some embodiments, the first inner spacer feature may include a first air gap and the second inner spacer feature comprises a second air gap, a volume of the second air gap may be greater than a volume of the first air gap. In some embodiments, the second air gap may extend into the epitaxial source/drain feature.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   receiving a workpiece comprising:
      a substrate,
      a vertical stack of semiconductor layers disposed over the substrate, the vertical stack comprising at least three channel layers interleaved by at least three sacrificial layers, the three channel layers comprising a first channel layer disposed over a second channel layer, and a third channel layer disposed under the second channel layer, and
      a dummy gate stack disposed over a channel region of the vertical stack;
   performing an etching process to remove a source/drain region of the vertical stack to form a source/drain trench, wherein the source/drain region is adjacent to the channel region along a first direction, and the source/drain trench exposes sidewalls of the three channel layers and the three sacrificial layers;
   selectively and partially etching the three sacrificial layers to form inner spacer recesses;
   forming inner spacer features in the inner spacer recesses, wherein the inner spacer features comprises a topmost inner spacer feature, a bottommost inner spacer feature, and a middle inner spacer feature disposed vertically between the topmost inner spacer feature and the bottommost inner spacer feature, and a width of the middle inner spacer feature is greater than a width of the bottommost inner spacer feature;
   forming an epitaxial source/drain feature in the source/drain trench;
   removing the dummy gate stack;
   selectively etching the three sacrificial layers to release the three channel layers in the channel region; and
   forming a gate structure to wrap around each of the three channel layers,
   wherein, after the performing of the etching process, a length of the second channel layer along the first direction is smaller than a length of the first channel layer and a length of the third channel layer.

2. The method of claim 1, wherein the forming of the inner spacer features comprises:
   depositing a dielectric material layer over the workpiece, and
   etching back the dielectric material layer to form dielectric layers in the inner spacer recesses, wherein the dielectric layers partially fill the inner spacer recesses, and wherein the depositing of the dielectric material layer forms:
      a first air gap sealed by the dielectric material layer and disposed between the first channel layer and the second channel layer, and
      a second air gap sealed by the dielectric material layer and disposed between the second channel layer and the third channel layer, wherein a volume of the second air gap is greater than a volume of the first air gap.

3. The method of claim 1,
   wherein, after releasing the three channel layers, the first channel layer is spaced apart from the second channel layer by the topmost inner spacer feature, and the second channel layer is spaced apart from the third channel layer by the middle inner spacer feature, wherein the topmost inner spacer feature comprises a first air gap and the middle inner spacer feature comprises a second air gap, wherein a volume of the second air gap is greater than a volume of the first air gap.

4. The method of claim 3, wherein the second air gap extends into the epitaxial source/drain feature.

5. A method, comprising:

forming a fin over a substrate, the fin comprising a plurality of channel layers interleaved by a plurality of sacrificial layers;

removing a portion of the fin to form a source/drain trench, wherein a top portion of the source/drain trench spans a first width, a middle portion of the source/drain trench spans a second width, and a bottom portion of the source/drain trench spans a third width, wherein the second width is greater than the first width and the third width;

selectively removing portions of the plurality of sacrificial layers to form inner spacer recesses;

forming inner spacer features in the inner spacer recesses;

forming a source/drain feature in the source/drain trench, wherein a first inner spacer feature of the inner spacer features comprises a first void exposing a first portion of a sidewall surface of the source/drain feature, and a second inner spacer feature of the inner spacer features comprises a second void exposing a second portion of the sidewall surface of the source/drain feature, the first portion curves outward, and the second portion curves inward; and replacing remaining portions of the plurality of sacrificial layers with a gate structure.

6. The method of claim 5, wherein the forming of the inner spacer features comprising:

performing a deposition process to form a dielectric layer over the substrate and in the inner spacer recesses; and etching back the dielectric layer to form the inner spacer features.

7. The method of claim 5, wherein a third inner spacer feature of the inner spacer features comprises a third void disposed over both the first void and the second void, wherein the first void, second void, and third void span different widths.

8. The method of claim 7, wherein the second void is disposed between the first void and the third void, and a width of the second void is greater than a width of the first void and a width of the third void.

9. The method of claim 7, wherein the first void, the second void, and the third void have different heights.

10. The method of claim 5, wherein, after forming the source/drain trench, a bottommost channel layer of the plurality of channel layers spans a first width, a topmost channel layer of the plurality of channel layers spans a second width, and a middle channel layer disposed between the bottommost channel layer and the topmost channel layer spans a third width, wherein the third width is less than the first width and the second width.

11. The method of claim 10, wherein the first width is greater than the second width.

12. The method of claim 5, wherein the inner spacer recesses have different dimensions.

13. A method, comprising:

forming a fin over a substrate, the fin comprising a plurality of channel layers interleaved by a plurality of sacrificial layers;

removing a source/drain region of the fin to form a source/drain opening;

selectively recessing the plurality of sacrificial layers to form inner spacer recesses;

forming inner spacer features in the inner spacer recesses;

forming a source/drain feature in the source/drain opening;

selectively removing the plurality of sacrificial layers to form gate openings; and forming a gate structure in the gate openings, wherein a topmost inner spacer feature of the inner spacer features comprises a first void, a bottommost inner spacer feature of the inner spacer features comprises a second void, and a middle inner spacer feature of the inner spacer features disposed between the topmost inner spacer feature and the bottommost inner spacer feature comprises a third void, a volume of the third void is greater than a volume of the second void.

14. The method of claim 13, wherein the middle inner spacer feature further comprises a dielectric layer in direct contact with the gate structure, and the third void is separated from the gate structure by the dielectric layer.

15. The method of claim 14, wherein the third void is separated from a bottommost channel layer of the plurality of channel layers by the dielectric layer.

16. The method of claim 13, wherein a bottommost channel layer of the plurality of channel layers spans a first width, a topmost channel layer of the plurality of channel layers spans a second width, and a middle channel layer disposed between the bottommost channel layer and the topmost channel layer spans a third width, wherein the third width is less than the first width and the second width.

17. The method of claim 5, wherein the first void spans a first height and a first width, the second void spans a second height greater than the first height and a second width greater than the first width.

18. The method of claim 5, wherein the first inner spacer feature is a topmost inner spacer feature of the inner spacer features, and the second inner spacer feature is disposed under the first inner spacer feature and over a bottommost inner spacer feature of the inner spacer features, wherein a volume of the second void is greater than a volume of the first void and a volume of a void of the bottommost inner spacer feature.

19. The method of claim 13, wherein the third void extends into the source/drain feature.

20. The method of claim 13, wherein the volume of the third void is greater than a volume of the first void.

* * * * *